United States Patent [19]
Holzman et al.

[11] Patent Number: 5,923,234
[45] Date of Patent: Jul. 13, 1999

[54] HERMETIC FEEDTHROUGH USING THREE-VIA TRANSMISSION LINES

[75] Inventors: Eric Louis Holzman, Medford; Stephen Charles Miller, Haddonfield, both of N.J.; Richard Joseph Teti, Drexel Hill; Bradley David Dufour, Phila., both of Pa.

[73] Assignee: Lockheed Martin Corp., Moorestown, N.J.

[21] Appl. No.: 08/958,621

[22] Filed: Oct. 27, 1997

[51] Int. Cl.⁶ .............................. H01P 3/08; H01L 23/02; H05K 5/06

[52] U.S. Cl. ....................... 333/238; 333/246; 174/262; 174/52.4; 257/698; 361/752; 361/796

[58] Field of Search ..................... 333/246, 247, 333/254, 260, 238; 174/52.1, 52.3, 52.4, 260–262, 264–266; 361/730, 736, 748, 752, 760, 772, 777, 792, 796, 803; 257/698, 700, 728

[56] References Cited

U.S. PATENT DOCUMENTS

| | | | |
|---|---|---|---|
| 4,725,878 | 2/1988 | Miyauchi et al. | 257/664 |
| 4,875,087 | 10/1989 | Miyauchi et al. | 257/664 |
| 4,922,325 | 5/1990 | Smeltz, Jr. | 357/74 |
| 5,014,115 | 5/1991 | Moser | 257/730 X |
| 5,229,727 | 7/1993 | Clark et al. | 333/238 X |
| 5,280,413 | 1/1994 | Pai | 361/760 X |
| 5,294,897 | 3/1994 | Notani et al. | 257/728 X |
| 5,315,486 | 5/1994 | Fillion et al. | 361/760 X |
| 5,517,747 | 5/1996 | Pierro et al. | 361/748 X |
| 5,644,277 | 7/1997 | Gulick et al. | 333/247 X |
| 5,675,302 | 10/1997 | Howard et al. | 333/260 X |
| 5,689,216 | 11/1997 | Sturdivant | 333/260 X |
| 5,757,252 | 5/1998 | Cho et al. | 174/262 X |
| 5,770,816 | 6/1998 | McNulty et al. | 257/723 X |

*Primary Examiner*—Robert Pascal
*Assistant Examiner*—Barbara Summons
*Attorney, Agent, or Firm*—W. H. Meise; S. D. Weinstein

[57] ABSTRACT

A hermetically sealed housing (10) includes a dielectric end portion (118) which provides a transmission-line feedthrough between a printed-circuit such as HDI and exterior connections. A first transmission line (1) on the PC board (30) transitions to a 3-via transmission line (4), which transitions to a third coplanar, microstrip, or stripline transmission line (3). The third transmission line (3) transitions to a second 3-via transmission line (5), which ends at a coplanar transmission line (2) which is outside the housing.

7 Claims, 10 Drawing Sheets

5,923,234

HERMETIC FEEDTHROUGH USING THREE-VIA TRANSMISSION LINES

FIELD OF THE INVENTION

This invention relates to housings for electronic equipment, and more particularly to hermetic feedthroughs for high-frequency signals.

BACKGROUND OF THE INVENTION

An advantageous method for interconnection of multiple integrated circuits on modules is known as High Density Interconnect (HDI). In this arrangement for interconnection of integrated circuits, generally speaking, wells are defined in the module, which accept the various integrated circuit chips, and which hold the chips with their upper surfaces coplanar. The metallized contacts or terminals on the upper surfaces are then interconnected in the desired manner by thin, flexible, printed-circuit sheets. Interconnections between the layers of the printed-circuit sheets, and between the circuits on the sheets and the terminals on the integrated-circuit chips, are accomplished by way of metallized vias. Such HDI modules have various advantages, including good heat-sinking of the integrated-circuit chips, and the possibility of repair of a module in which one chip is bad, by stripping off the interconnecting sheet, replacing the defective chip, and replacing the chip interconnections by use of the same, or a new interconnection sheet.

Many HDI modules are intended for use in adverse environments, in which it is desired that the module be hermetically sealed against environmental factors. This means that the interconnections between the circuits within the module and the outside world must occur in a hermetic fashion. In some applications, the signals applied to the HDI module, or the signals leaving the HDI module, may be at sufficiently high frequencies that distributed reactances have effects on the signal transmission. Those skilled in the art know that the appropriate way to transport signals at such high frequencies is the use of distributed transmission lines having substantially constant characteristic impedances along their lengths, or if the impedances along their lengths vary, by the use of appropriate impedance transformations. It should be noted that the term "high frequency" in this context is technology-sensitive, in that in the early days of radio, frequencies in the range of 550 to 1600 kilocycles per second (kc or KHz) would have been considered to be difficult to work with because of distributed effects, while with current technology and its very small components, such effects are considered to be relatively small below about 50 MHz, except possibly for special purposes.

Improved devices and/or methods for making hermetic high-frequency connections between elements and chips inside an HDI module and the world external to the HDI module are desired.

SUMMARY OF THE INVENTION

In general, a hermetically sealed housing according to the invention includes a dielectric end portion which provides a transmission-line feedthrough between a printed-circuit such as HDI and exterior connections. A first transmission line on the PC board transitions to a 3-via transmission line, which transitions to a third coplanar, microstrip, or stripline transmission line. The third transmission line transitions to a second 3-via transmission line, which ends at a coplanar transmission line which is outside the housing.

More particularly, the arrangement according to the invention includes a housing and a printed-circuit board defining a transmission line. The printed-circuit board may be flexible. The arrangement comprises an end portion of the housing made from a dielectric material, such as ceramic. The remaining portion of the housing may be metallic. The end portion of the housing defines a flat lower surface, which may be metallized, and also defines planar first and second upper surfaces, each of which is parallel with the flat lower surface. The first and second upper surfaces may be coplanar. The first and second upper surfaces of the end portion of the housing are separated from each other by a notch extending from the planes of the first upper surface and the second upper surface part-way to the lower surface of the end portion of the housing, leaving a joining portion of the end portion of the housing supporting the first and second upper surfaces relative to each other. In one embodiment of the invention, the notch in the end portion of the housing is part of a seal ring retaining well. The printed-circuit board includes a portion defining a first unbalanced transmission line by which connection is made between the exterior of the housing and elements associated with the printed-circuit board. The first unbalanced transmission line includes an electrical strip conductor and an electrical ground plane lying at least to the sides of the strip conductor. The first unbalanced transmission line may be a coplanar transmission line or a microstrip transmission line. At least a portion of the printed-circuit board defining the first unbalanced transmission line extends over at least a part of the first upper surface of the end portion of the housing. The first unbalanced transmission line ends at a first transverse plane perpendicular to the first upper surface and transverse to the direction of electromagnetic energy flow on the first transmission line. A coplanar second unbalanced transmission line is defined on the second upper surface, and extends from a second transverse plane to a third transverse plane, both of which are parallel to the first transverse plane. The second unbalanced transmission line defines a strip conductor and ground planes lying on both sides of the strip conductor. A portion of the second unbalanced transmission line near the third transverse plane is available for connections to circuits outside of the housing. A third unbalanced transmission line lies in an intermediate plane, which lies between the planes of the upper and lower surfaces of the end portion of the housing. The third unbalanced transmission line defines a strip conductor and an electrical ground plane lying at least to the sides of the strip conductor. As with the first unbalanced transmission line, the third unbalanced transmission line may be a coplanar line, or it may be stripline or a microstrip line. The third unbalanced transmission line extends between the first and second transverse planes. The arrangement also includes a planar first three-conductor transmission line extending in the first transverse plane between the first unbalanced transmission line and the third unbalanced transmission line. The first three-conductor transmission-line includes a center via connected at one end to the strip conductor of the first unbalanced transmission line, and at the other end to the strip conductor of the third unbalanced transmission line. The first three-conductor transmission line also includes first and second ground vias symmetrically disposed relative to the center via. The first and second ground vias of the first three-conductor transmission line are connected at one end to the ground plane of the first unbalanced transmission line at locations symmetrically disposed about the strip conductor of the first transmission line. The first and second ground vias of the first three-conductor transmission line are connected at their other ends to the ground plane of the third unbalanced transmission line at locations symmetrically disposed about the strip conductor of the third unbalanced transmission line. A planar second three-conductor transmission line extends in the second transverse plane between the second unbalanced transmission line and the third unbalanced transmission line. The second three-conductor transmission-line includes a center via connected at one end to the strip conductor of the second unbalanced transmission line, and at its other end to the strip conductor of the third unbalanced transmission line. The second three-conductor transmission line also includes first and second ground vias symmetrically disposed relative to the center via. The first and second ground vias of the second three-conductor transmission line are connected at one end to the ground plane of the second unbalanced transmission line at locations symmetrically disposed about the strip conductor of the second transmission line. The first and second ground vias of the second three-conductor transmission line are connected at their other ends to the ground plane of the third unbalanced transmission line at locations symmetrically disposed about the strip conductor of the third unbalanced transmission line.

DESCRIPTION OF THE INVENTION

Figure 1:
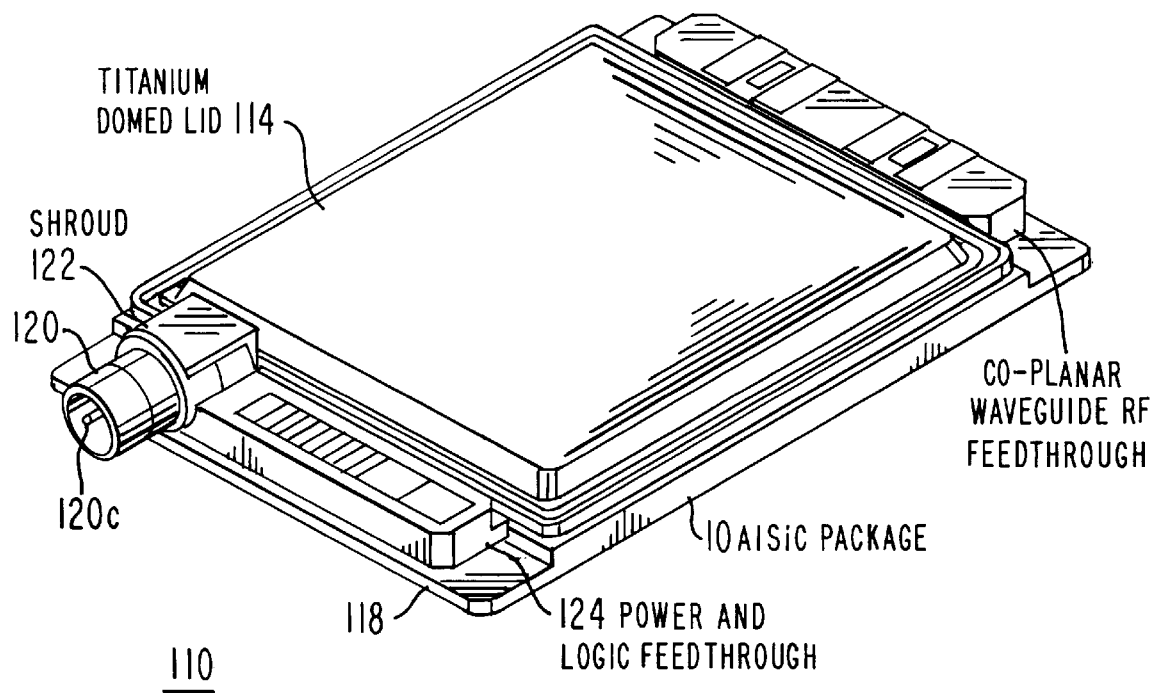
FIG. 1 is a simplified perspective or isometric view of an assembled module, which contains a printed-wiring board, such as an HDI circuit.

FIG. 1 is a simplified perspective or isometric view of an assembled HDI module 110, illustrating a housing or package 10, which may be electrically conductive or nonconductive, but which in the illustrated arrangement is conductive AlSiC material. A slightly domed lid 114 of titanium overlies the chips and other elements located within the housing 10. A nonconductive ceramic end piece 118 provides power and logic circuit feedthroughs, illustrated together as 124. The high-frequency connections are provided by a feedthrough arrangement, not visible in FIG. 1, which lies near a coaxial connector 120 having a center conductor 120c. An electrically conductive shroud 122 covers at least a portion of the connections between the coaxial connector 120 and the connections within the housing 10, to help in avoiding stray radiation.

Figure 2:
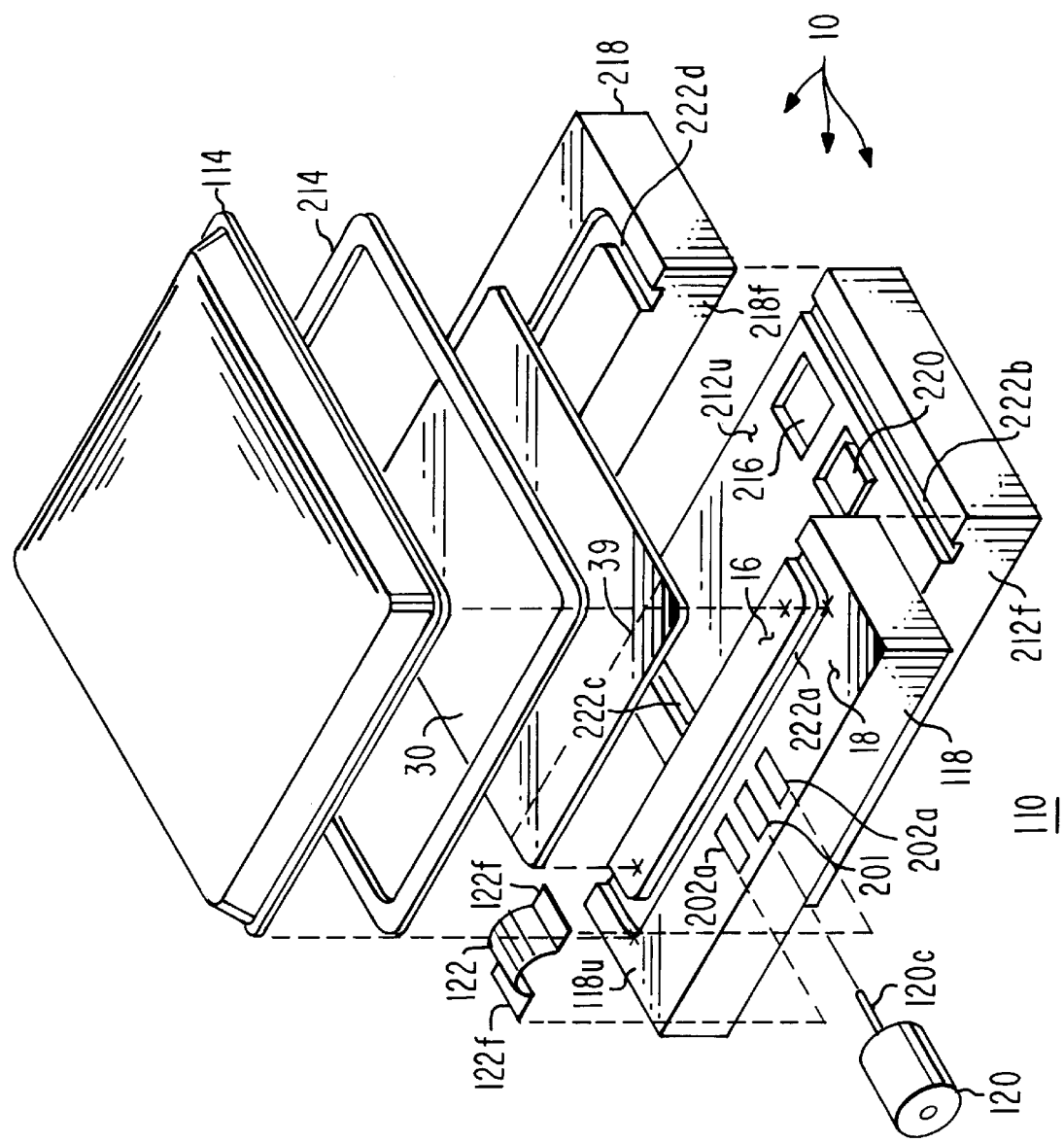
FIG. 2 is a simplified, exploded view of the arrangement of FIG. 1, showing the relationships among the elements thereof.

FIG. 2 is a simplified, exploded view of the arrangement of FIG. 1, showing the relationships among the elements thereof. In FIG. 2, elements corresponding to those of FIG. 1 are designated by like reference numerals. In FIG. 2, the housing 10 is seen to be made up of the electrically conductive portion 212 which defines an upper surface 212u in which various wells, suggested by well 216, are filled with integrated-circuit chips 220, so that the upper surfaces of the chips are coplanar, and either at, or very near the same plane as the upper surface 212u. As illustrated in FIG. 2, nonconductive end portion 118 is affixed to conductive housing portion 212 along a front surface 212f of conductive housing portion 212, as by brazing or the use of adhesives. A similar nonconductive end portion 218 is affixed, by its surface 218f, to the rear of conductive housing portion 212.

In the arrangement of FIG. 2, the nonconductive end portion 118 defines a flat upper surface 118u, which, when the nonconductive end portion 118 is affixed to conductive portion 212 of the housing 10, is coplanar with upper surface 212u. The upper surface of rear end portion 218 is similarly coplanar with the upper surface 212u of conductive portion 212 of housing 10. The upper surface 118u of end portion 118 defines a depressed channel 222a, which matches with similar channels 222b and 222c defined in the upper surface 212u of conductive portion 212 of housing 10. A similar channel 222d is defined in the upper surface of rear end portion 218. When the end portions 118 and 218 are assembled to the conductive portion 212 of housing 10, these channels combine to form a continuous peripheral channel or notch 20 (FIG. 3) around the outer periphery of the housing 10. The channel 222 is dimensioned to accommodate a titanium seal ring 214, which provides a portion of the desired hermetic seal between the housing 10 and the domed lid 114.

As further illustrated in FIG. 2, a thin, flexible, dielectric interconnection sheet 30, imprinted with conductive leads, extends over the upper surface 212u of the conductive portion 212 of the housing 10 to provide interconnections, by way of conductive vias, with the various electrodes or terminals (not illustrated) of the integrated circuit chips, such as chip 220. A portion 39 of interconnection sheet 30 extends over the upper surface 118u, to provide a region in which interconnections are made, as described below, between the interconnection sheet 30 and metallized surface electrodes or terminals, such as terminals 201, 202a, and 202b. Also, the center conductor 120c of coaxial connector 120 is electrically, and preferably mechanically, affixed to terminal 201, and shroud 122 is affixed at its ends to terminals 202a and 202b.

Figure 3:
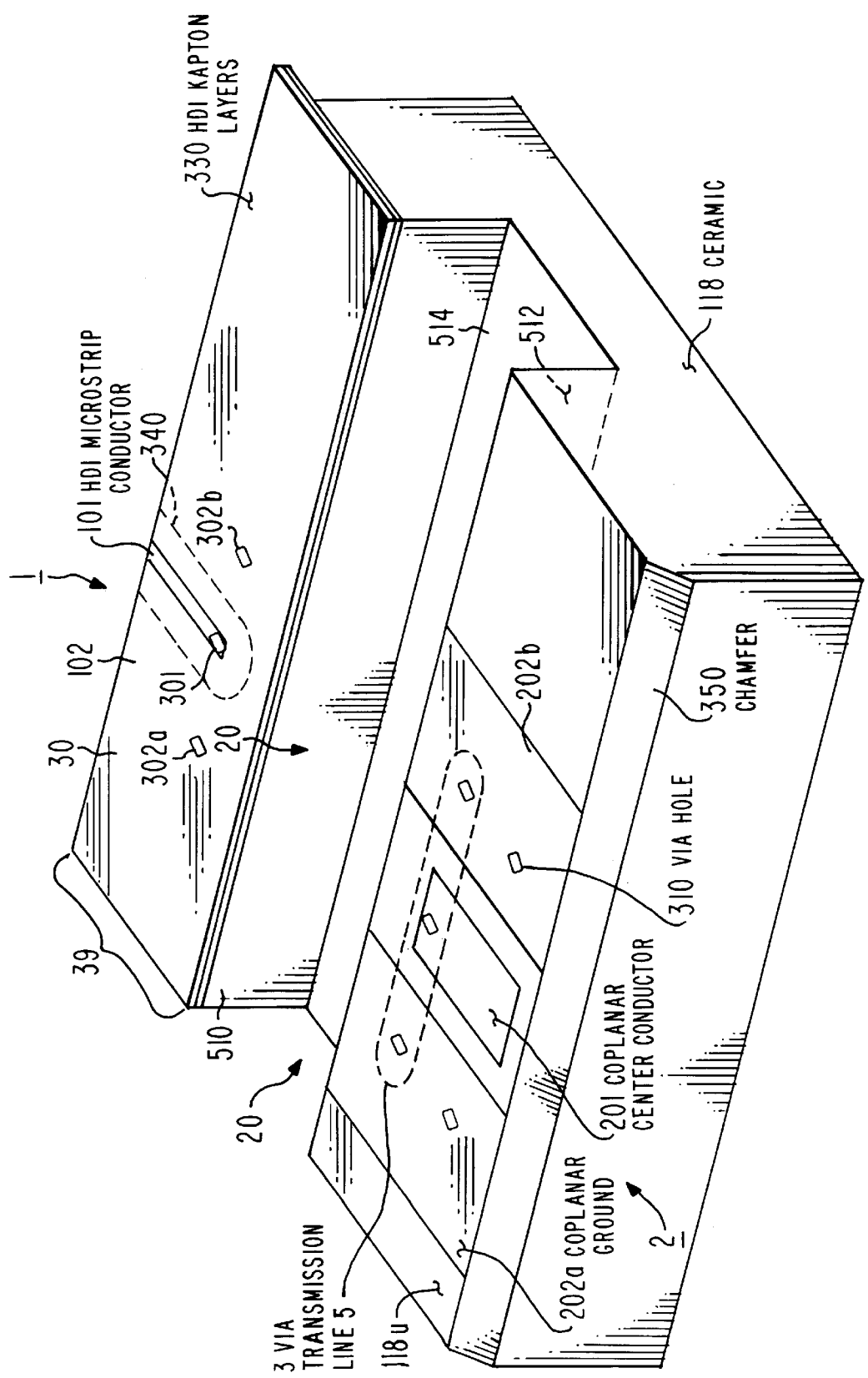
FIG. 3 is a simplified perspective or isometric view of a portion of the end piece of FIGS. 1 and 2.

FIG. 3 is a simplified view of a portion of the electrically nonconductive or ceramic end portion 118 of the housing 10 of FIGS. 1 and 2. In FIG. 3, the upper surface of HDI interconnection sheet 30 includes an uppermost Kapton layer 330, and a transmission line center or strip conductor (HDI microstrip conductor) is illustrated as 101. Strip conductor 101 is a portion of a transmission line defined by the interconnection sheet 30, which transports or carries signals between the outside world and those chips or other components which are supported by the housing 212. The ground plane 102 associated with strip conductor 101 lies outside (away from) the strip conductor 101, beyond a boundary illustrated by dashed line 340. As illustrated, strip conductor 101 ends or terminates at a conductive via 301. As described below, additional transmission lines carry the signals between the transmission line of which strip conductor 101 and ground plane 102 are a part and the terminals 201, 202a, and 202b, which are accessible to the outside world.

FIG. 3 is a simplified perspective or isometric view of a portion of the end piece of FIGS. 1 and 2. Notch 20 defines first and second side surfaces 510 and 512, respectively, and a bottom surface 514. In FIG. 3, conductive vias, some of which are designated 310, extend through the ceramic from upper surface 118u of portion 18 FIG. 2 of end portion 118 to lower layers. Three such vias are circled, and indicated as being part of a three-conductor or three-via transmission line designated as 5. A chamfer 350 is illustrated at an edge of end portion 118, which aids in making a low-loss impedance transformation between the coplanar transmission line 2 center conductor 201 and the center conductor 120c of the connector 120.

Figure 4:
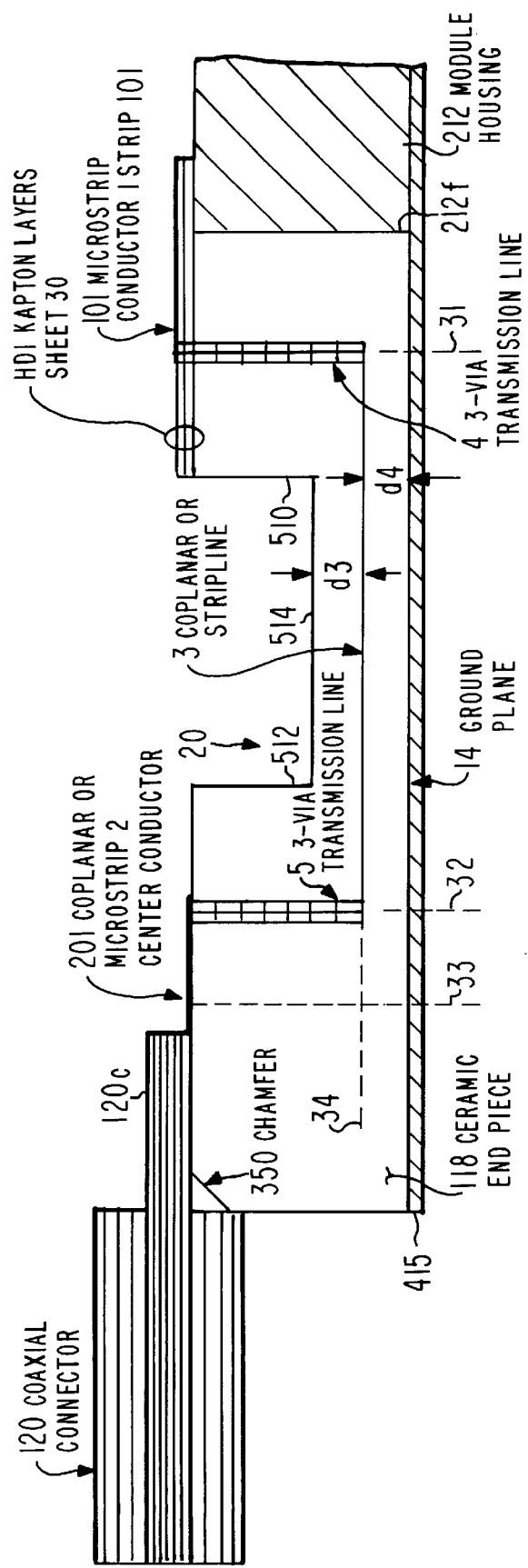
FIG. 4 is a simplified cross-sectional view of the arrangement of FIG. 3.

FIG. 4 is a cross-sectional view of the arrangement of FIG. 3. In FIG. 4, elements corresponding to those of FIGS. 1, 2, and 3 are designated by like reference numbers. In FIG. 4, the interconnection between HDI transmission line 1 and coplanar transmission line 2 can be seen to include a coplanar or stripline transmission line 3 extending from transverse plane 31 to transverse plane 32. A coplanar transmission line is one in which the ground plane(s) and the strip conductor lie in the same plane; a stripline transmission line includes a strip conductor in one plane, with ground planes in different planes slightly above and below the strip conductor; for purposes of comparison, a "microstrip" transmission line is a stripline with a single nearby ground plane. Transmission line 3 lies in a plane 34, which lies between, and is parallel with, bottom surface 514 of notch 20 and ground plane 14 on the bottom surface of the end piece 118, and which is also parallel with the upper surfaces 16 and 18 FIG. 2 of end piece 118. As illustrated in FIG. 4, the dimension between bottom surface 514 of notch 20 and plane 34 is d3, and the dimension between plane 34 and the bottom surface 415 of end piece 118 is d4. A 3-via transmission line 4 extends, "within" plane 31, from HDI transmission line 1 to the right end of coplanar or stripline transmission line 3, thus forming a continuous transmission line including transmission lines 1, 3, and 4. Also in FIG. 4, another 3-via transmission line 5 extends "within" plane 32 from an end of coplanar or microstrip transmission line 2 to the left end of coplanar or stripline transmission line 3. This has the effect of connecting transmission lines 1, 2, 3, 4, and 5 together, for providing a continuous path for the transmission of energy from components, such as chip 220 of FIG. 2 mounted within housing 10 (FIG. 1), to the external terminals or metallizations 201, 202a, 202b (FIG. 2).

FIG. 4 also illustrates the various Kapton layers of sheet 30, a ground plane or metallization 14 on the bottom surface of end piece 118, and the location of coaxial conductor 120 and its center conductor 120c.

Figure 5:
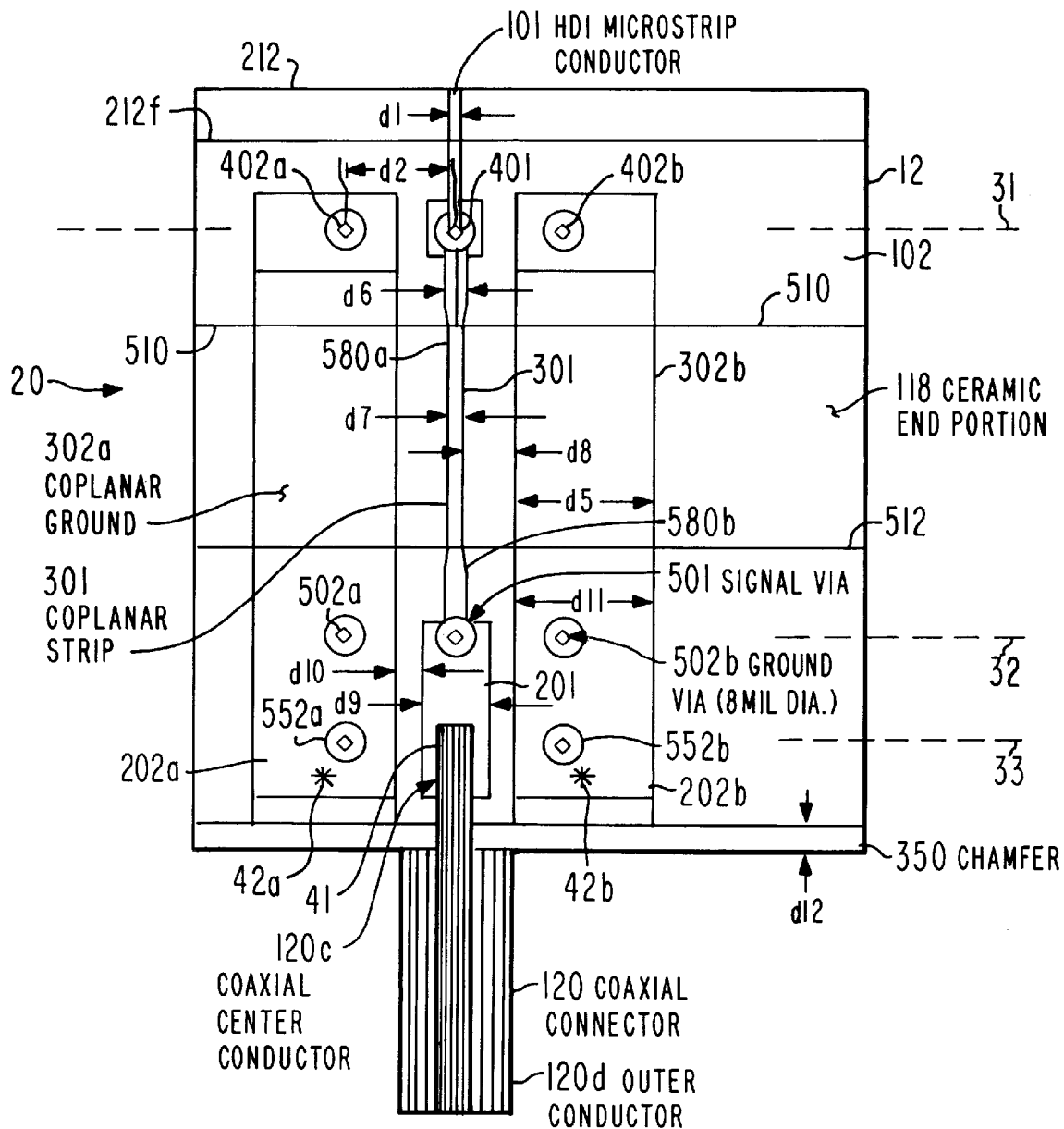
FIG. 5 is a simplified plan view of the structure of FIG. 4, showing various levels of the structure.

FIG. 5 is a top or plan view of the arrangement of FIG. 4, illustrating some details of the configurations of the transmission lines at different levels in the structure. In FIG. 5, HDI microstrip transmission line 1 strip conductor 101 has a transverse dimension or width d1, overlies ground plane 102, and extends to transverse plane 31. Ground plane 102, which is associated with transmission line 1, extends from the upper portion of FIG. 5 to face 510, where it ends at the edge of the notch 20. The end of strip conductor 101 of transmission line 1 connects to the "upper" end (the end nearest the viewer) of center via 401 of transmission line 4, which lies "within" transverse plane 31. The two ground vias 402a and 402b of transmission line 4 also lie "in" transverse plane 31, equidistant from center via 401 by a dimension d2.

In FIG. 5, transmission line 3, which lies in plane 34 of FIG. 4, includes center or strip conductor 301, which extends from transverse plane 31 to transverse plane 32. As illustrated in FIG. 5, transmission line 3 is a coplanar transmission line, in which strip conductor 301 is associated with two ground conductors, 302a and 302b, lying on each side of the strip conductor, and in essentially the same plane as the strip conductor. The width of each ground conductor 302a, 302b of transmission line 3 is d5. The center or strip conductor 301 of transmission line 3 has a width dimension of d6 at locations which are not overlain by notch 20, and a narrower width dimension of d7 at locations overlain by notch 20. The transitions in width of center or strip conductor 301 of transmission line 3 occur in transition regions 580a and 580b adjacent to the faces or walls 510, 512 defining notch 20. The dimension between the edge of the strip conductor 301 and the edge of an adjacent ground conductor 302a or 302b in the region overlain by notch 20 is designated d8.

The center via 501 of 3-via transmission line 5 connects to the end of strip conductor 301 at plane 32, The ground vias 502a and 502b associated with center via 501 are connected to coplanar ground planes 302a and 302b, also at transverse plane 32. At the upper end of transmission line 5, the center via 501 connects to coplanar strip conductor 201 of transmission line 2 at plane 32. Also at the upper end of 3-via transmission line 5, the ground vias 502a and 502b connect to coplanar ground conductors 202a and 202b of transmission line 2, respectively.

In FIG. 5, coplanar transmission line 2 extends from transverse plane 32 to transverse plane 33. The width of center strip conductor 201 of coplanar transmission line 2 is designated d9, and the separation between center strip conductor 201 and coplanar ground conductor 202a is designated d10. The width of a ground plane 202a, 202b of transmission line 2 is designated d11. At transverse plane 33, an additional ground via 552a extends between, and connects together, ground planes 302a and 202a, and a further ground via 552b extends between, and connects together, ground planes 302b and 202b. In one embodiment, the diameters of the vias is 8 mils. The width d12 of the chamfer 350 is 15 mils.

In FIG. 5, if a coplanar transmission line, instead of a coaxial connector 120, is to be connected to coplanar transmission line 2, the center strips are connected together near connection point 41 of center or strip conductor 201, and the ground conductors are connected at 42a and 42b on ground strips 202a and 202b, respectively. If, as illustrated in FIG. 5, coaxial connector 120 is to be connected to coplanar transmission line 2, the center conductor 120c is connected, as by soldering or brazing, to center or strip conductor 201 at a location near point 41. The outer conductor 120o must be connected to the two ground conductors 202a, 202b. This is accomplished by the use of solder or conductive epoxy. In order to reduce stray radiation from the exposed portion of transmission line 2, the shroud 122 (FIG. 2) is placed over the exposed portion of transmission line 2, and its flanges 122f (FIG. 2) are electrically connected to ground strips 202a, 202b.

Figure 6B:
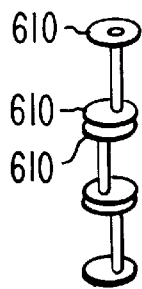
FIG. 6b is a simplified conceptual view of a plurality of vias of various layers of FIG. 6a concatenated to form an elongated via.
Figure 6A:
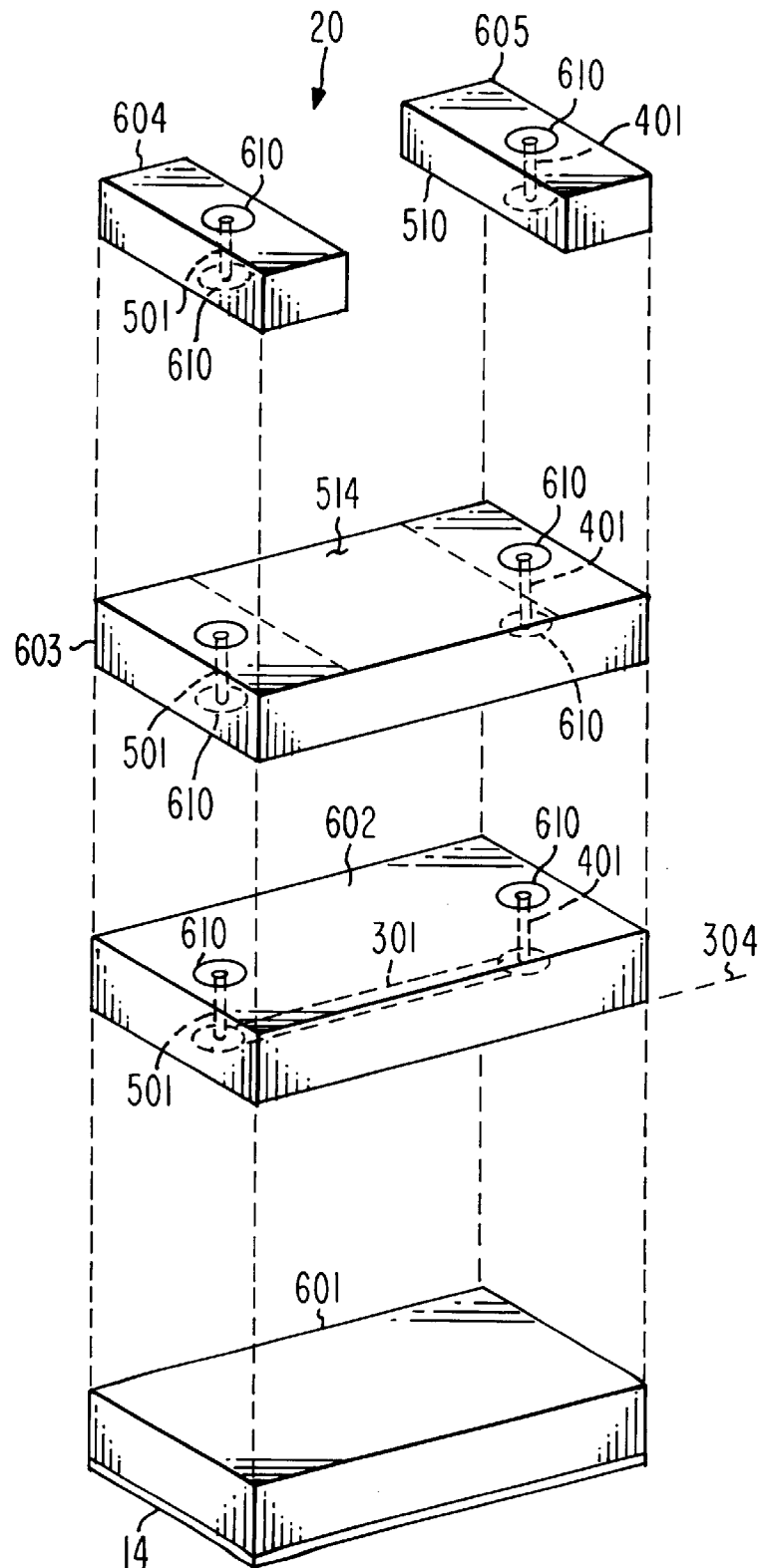
FIG. 6a is simplified, conceptually exploded view of the make-up or structure of the ceramic end piece of FIGS. 3, 4, and 5, showing how the vias are arranged.

FIG. 6a is an exploded, perspective or isometric view of a portion of end portion 118 of the housing 10, illustrating how the ceramic structure is made up of various layers, and how the vias are oriented relative to catch pads. In FIG. 6a, the bottommost layer 601 of ceramic is bare, except for the attachment of a metallization layer 14 to its bottom surface. The next upper layer 602 of ceramic has two vias, namely vias 401 and 501 extending between its upper and lower surfaces. The metallization on the interior of the vias 401 and 501 connects to catch pads 610 on the upper and lower surfaces. These catch pads are used to provide continuity between layers of ceramic, since it is difficult to guarantee that the vias themselves will properly align from one layer to another. The catch pads provide a measure of tolerance. The effect of the capacitance of the catch pads on the impedance of the associated transmission line can be adjusted by compensating adjustment of the inter-via spacing of the transmission line.

Similarly, layer 603 of ceramic in FIG. 6*a* has individual portions of vias 401 and 501, and associated catch pads 610. The two uppermost layers 604 and 605 of ceramic overlie layer 603, but are spaced apart to define at least a portion of notch 20.

FIG. 6*b* illustrates a single via conductor made up of vias in individual ceramic layers, showing how slight offsets of the vias in the various layers are compensated for by the catch pads.

Figure 7:
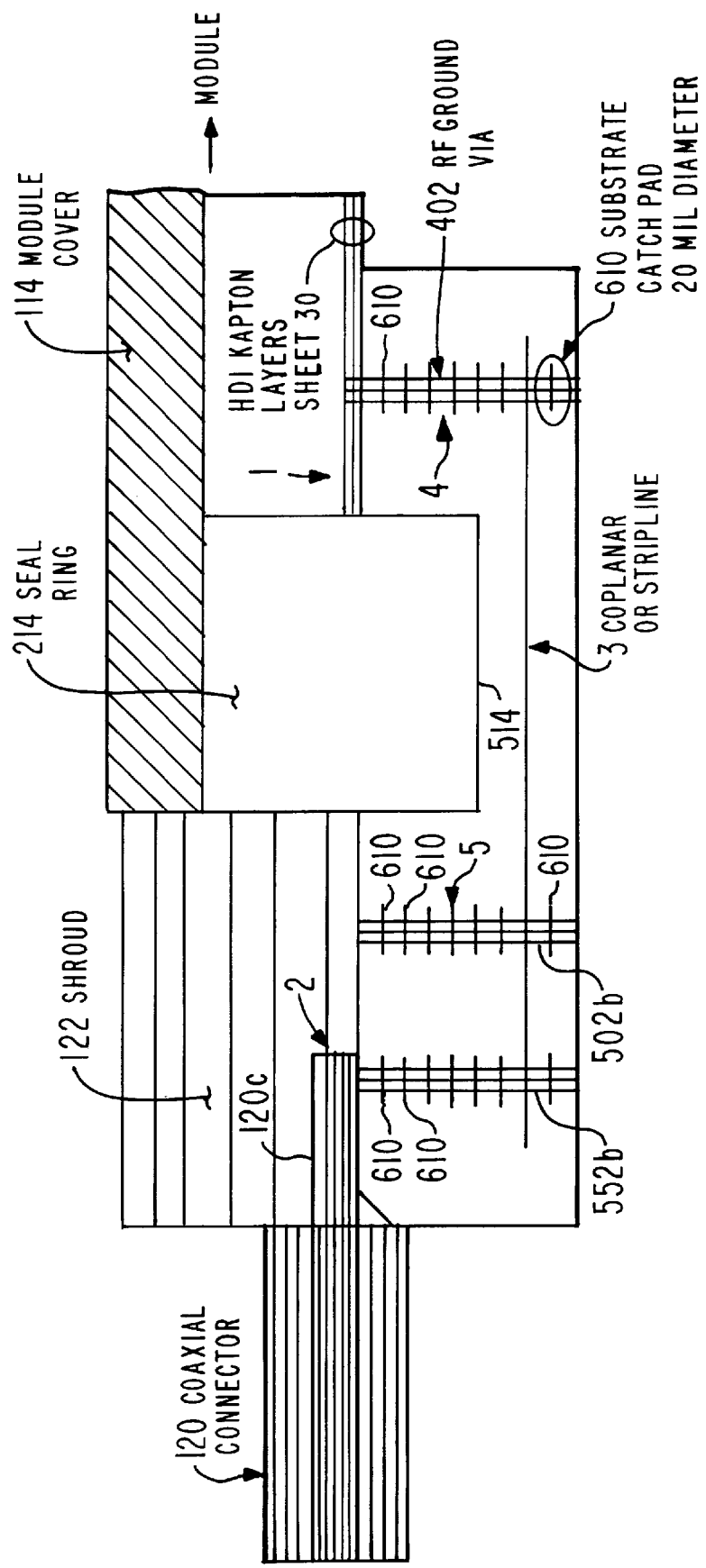
FIG. 7 is a simplified cross-sectional view of an end piece of the arrangement of FIG. 1, in its assembled form.

FIG. 7 is a cross-sectional view similar to that of FIG. 4, of the end portion of the housing, in its assembled state. In FIG. 7, the titanium seal ring is sandwiched between the module cover or lid 114 and the bottom 514 of notch 20, to provide a hermetic seal.

Figure 8:
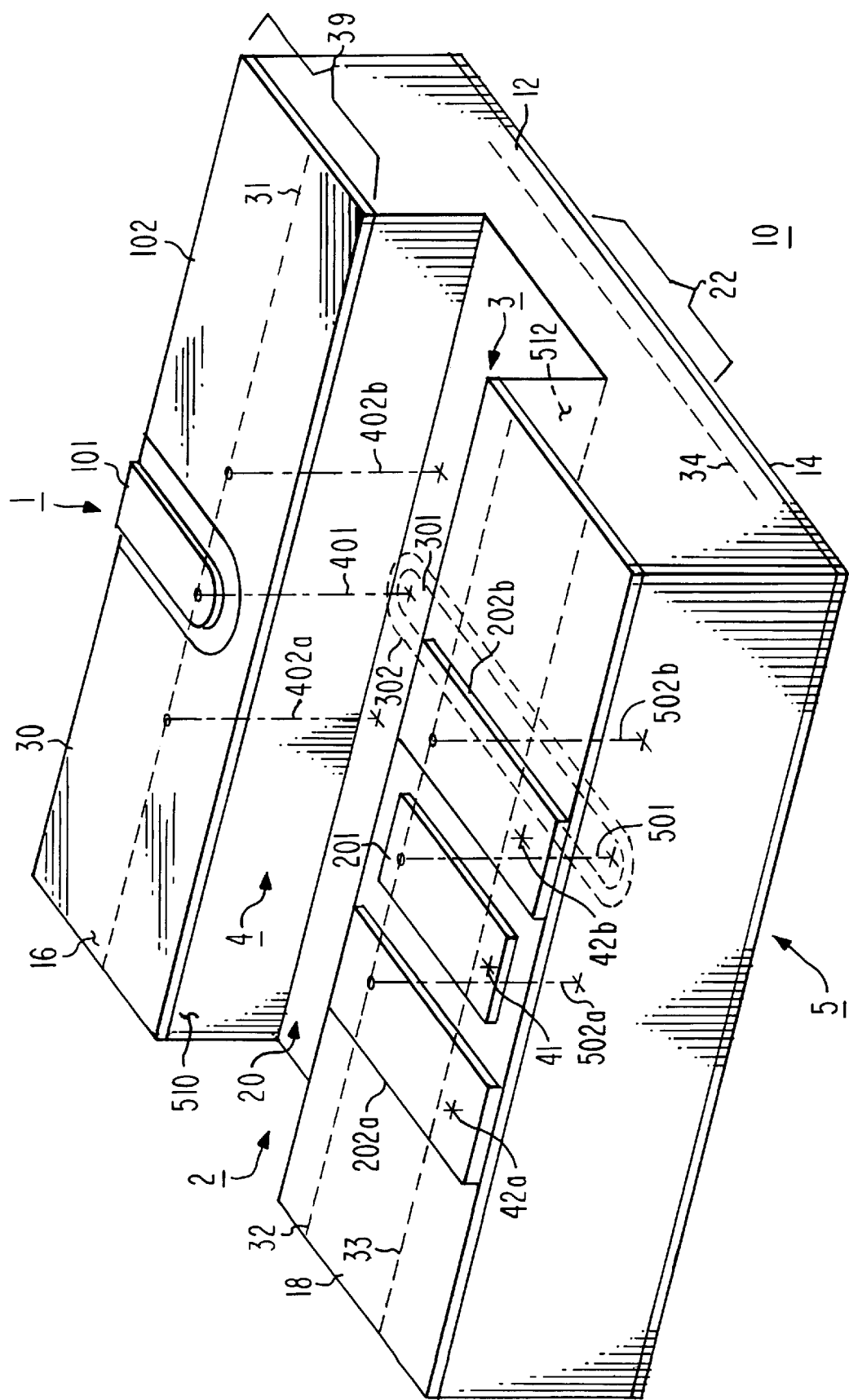
FIG. 8 is a simplified, isometric or perspective view, in phantom form, illustrating all of the transmission lines of the end piece as they occur in the end piece.

FIG. 8 is a perspective or isometric view, partially in phantom, illustrating the transmission lines 1, 2, 3, 4, and 5, and their relationship to the end piece 12.

Thus, the arrangement according to the invention as illustrated in FIGS. 1–8 includes a housing (10) and a printed-circuit board (30) defining a transmission line (1). The printed-circuit board (30) may be flexible. The arrangement comprises an end portion (12) of the housing (10) made from a dielectric material, such as ceramic. The remaining portion (212) of the housing (10) may be metallic. The end portion (12) of the housing (10) defines a flat lower surface, which may be metallized (14), and also defines planar first (16) and second (18) upper surfaces, each of which is parallel with the flat lower surface (14). The first (16) and second (18) upper surfaces may be coplanar. The first (16) and second (18) upper surfaces of the end portion (12) of the housing (10) are separated from each other by a notch (20) extending from the planes of the first upper surface (16) and the second (18) upper surface part-way to the lower surface (14) of the end portion (12) of the housing (10), leaving a joining portion (22) of the end portion (12) of the housing (10) supporting the first (16) and second (18) upper surfaces relative to each other. In one embodiment of the invention, the notch (20) in the end portion (12) of the housing (10) is part of a seal ring (214) retaining well (222). The printed-circuit board (30) includes a portion (39) defining a first unbalanced transmission line (1) by which connection is made between the exterior of the housing (10) and elements (such as 220) associated with the printed-circuit board (30). The first unbalanced transmission line (1) includes an electrical strip conductor (101) and an electrical ground plane (102) lying at least to the sides of the strip conductor (101). The first unbalanced transmission line (1) may be a coplanar transmission line or a microstrip transmission line. At least a portion (39) of the printed-circuit board (30) defining the first unbalanced transmission line (1) extends over at least a part of the first upper surface (16) of the end portion (12) of the housing (10). The first unbalanced transmission line (1) ends at a first transverse plane (31) perpendicular to the first upper surface (16) and transverse to the direction of electromagnetic energy flow on the first transmission line (1). A coplanar second unbalanced transmission line (2) is defined on the second upper surface (18), and extends from a second transverse plane (32) to a third transverse plane (33), both of which are parallel to the first transverse plane (31). The second unbalanced transmission line (2) defines a strip conductor (201) and ground planes (202*a*, 202*b*) lying on both sides of the strip conductor (201). A portion (terminals 41, 42*a*, 42*b*) of the second unbalanced transmission line (2) near the third transverse plane (33) is available for connections to circuits outside of the housing. A third unbalanced transmission line (3) lies in an intermediate plane (34), which lies between the planes of the upper (16, 18) and lower (14) surfaces of the end portion (12) of the housing (10). The third unbalanced transmission line (3) defines a strip conductor (301) and an electrical ground plane (302) lying at least to the sides of the strip conductor. As with the first unbalanced transmission line (1), the third unbalanced transmission line (3) may be a coplanar line, or it may be stripline or a microstrip line. The third unbalanced transmission line (3) extends between the first (31) and second (32) transverse planes. The arrangement also includes a planar first three-conductor transmission line (4) extending in the first transverse plane (31) between the first unbalanced transmission line (1) and the third unbalanced transmission line (3). The first three-conductor transmission-line (4) includes a center via (401) connected at one end to the strip conductor (101) of the first unbalanced transmission line (1), and at the other end to the strip conductor (301) of the third unbalanced transmission line (3). The first three-conductor transmission line also includes first (402*a*) and second (402*b*) ground vias symmetrically disposed relative to the center via (401). The first (402*a*) and second (402*b*) ground vias of the first three-conductor transmission line (4) are connected at one end to the ground plane (30) of the first unbalanced transmission line (1) at locations symmetrically disposed about the strip conductor (101) of the first transmission line (1). The first (402*a*) and second (402*b*) ground vias of the first three-conductor transmission line (4) are connected at their other ends to the ground plane (302) of the third unbalanced transmission line (3) at locations symmetrically disposed about the strip conductor (301) of the third unbalanced transmission line (3). A planar second three-conductor transmission line (5) extends in the second transverse plane (32) between the second unbalanced transmission line (2) and the third unbalanced transmission line (3). The second three-conductor transmission-line (5) includes a center via (501) connected at one end to the strip conductor (201) of the second unbalanced transmission line (2), and at its other end to the strip conductor (301) of the third unbalanced transmission line (3). The second three-conductor transmission line (5) also includes first (502*a*) and second (502*b*) ground vias symmetrically disposed relative to the center via (501). The first (502*a*) and second (502*b*) ground vias of the second three-conductor transmission line (5) are connected at one end to the ground plane (202*a*, 202*b*) of the second unbalanced transmission line (2) at locations symmetrically disposed about the strip conductor (201) of the second transmission line (2). The first (502*a*) and second (502*b*) ground vias of the second three-conductor transmission line (5) are connected at their other ends to the ground plane (302) of the third unbalanced transmission line (3) at locations symmetrically disposed about the strip conductor (301) of the third unbalanced transmission line (3).

Figure 9:
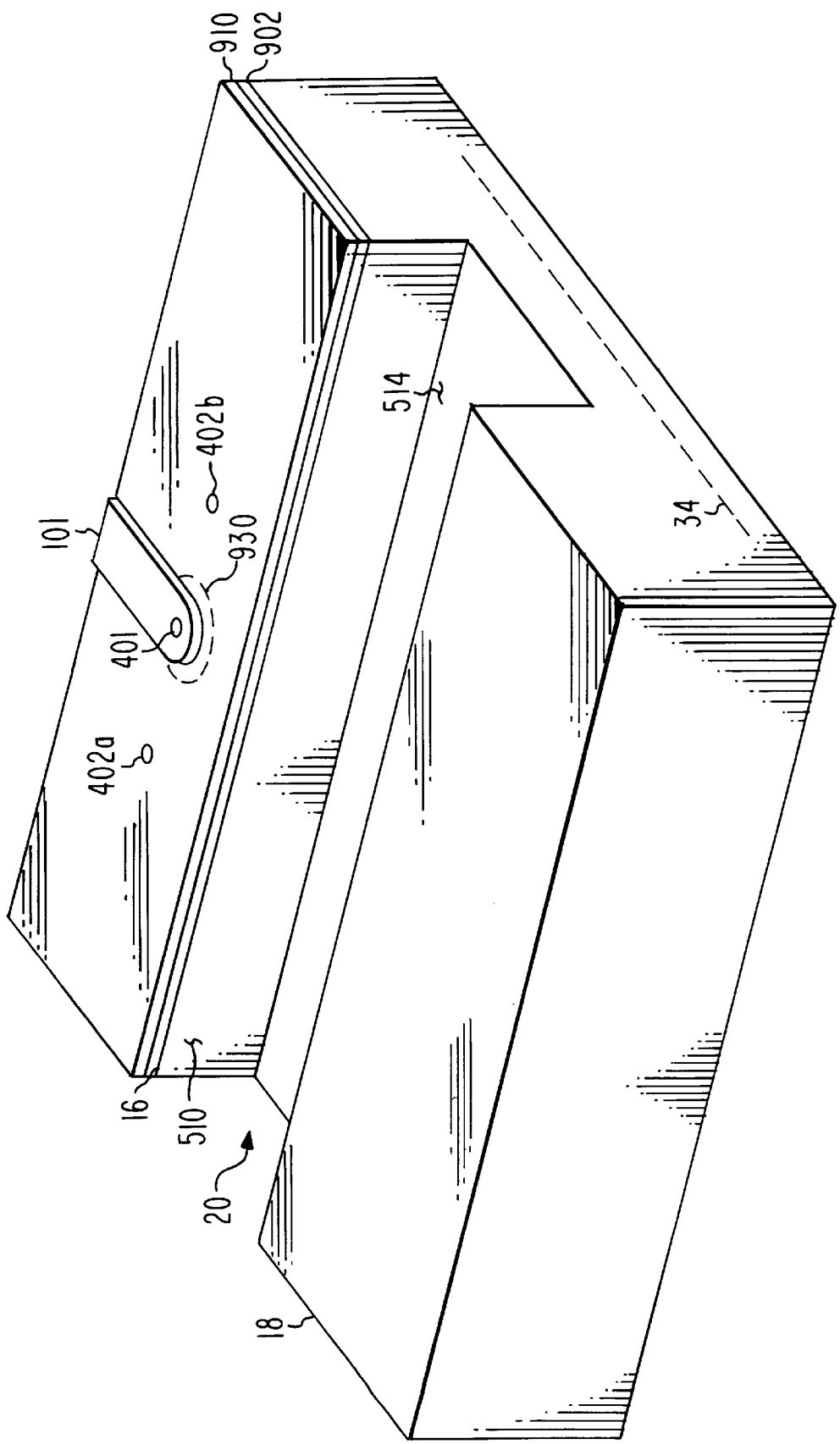
FIG. 9 is an illustration of a microstrip transmission-line alternative to the coplanar transmission line of FIG. 8.

In a particular embodiment of the invention illustrated in FIG. 9, the first unbalanced transmission line (1) is a microstrip transmission line in which the strip conductor (101) lies in a different plane from the ground plane (902), separated therefrom by a thin layer 910 of dielectric, and the ground plane (902) at the first transverse plane (31) extends continuously under the strip conductor (101), except in a region defined by dashed lines 930 surrounding the location of the center via (401) of the first three-conductor transmission line (4). The ground vias 402a and 402b of 3-via transmission line 4 extend upward only as far as ground plane 902.

In another embodiment, illustrated in FIG. 8, the first unbalanced transmission line (1) is a coplanar transmission line, in which the strip conductor (101) lies in the same plane as the ground plane (102).

The invention also contemplates an arrangement in which the seal member (214) lies in the notch (20), with the upper surface of the seal member essentially coplanar with the first upper surface (16), and a lid (114) extends over the housing (10) and the seal member (214). The lid (114) may be flat. In another contemplated version, a coaxial connector (120) is connected to the second unbalanced transmission line (2) at the third transverse plane (33). In such an arrangement, the center conductor (120c) of the coaxial connector (120) is mechanically and electrically connected to the strip conductor (201) of the second unbalanced transmission line (2). The center pin (120c) may extend away from the housing (10), parallel with the lower plane (14). The coaxial connector (120) is completed by a shroud (122) in the form of a half-cylinder. The shroud (122) is mounted on the ground conductors (202a, 202b) of the second unbalanced transmission line (2), with the axis of the half-cylinder coaxial with the axis of the center conductor (120c) of the coaxial connector (120).

Figure 10:
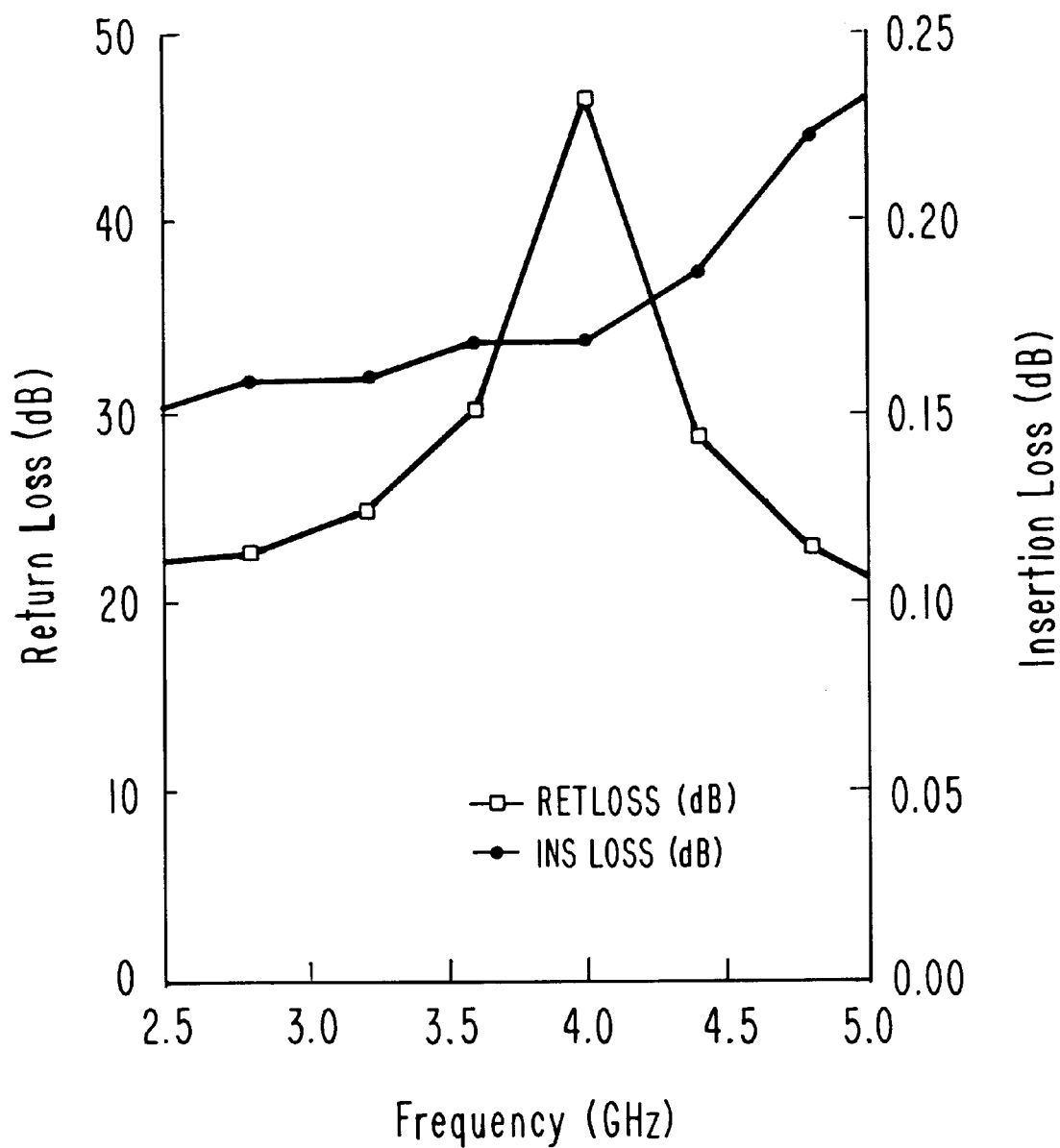
FIG. 10 plots calculated return loss and insertion loss for a transmission-line structure such as that of FIG. 8.

In an embodiment of the invention similar to that illustrated in FIGS. 3, 4, and 5, the ceramic material is cofired alumina, and dimension d1 is seven mils, dimension d2 is sixty mils, dimensions d3 and d4 are each twenty mils, dimension d5 is 76 mils, dimension d6 is 12 mils, dimension d7 is 8.6 mils, spacing d8 is 27 mils, width d9 is 37 mils, spacing d10 is 15 mils, width d11 is 76 mils. In this embodiment, the transmission characteristics are illustrated in the plots of FIG. 10. In FIG. 10, the return loss, measured in 50 ohms, is a maximum of about 48 dB at 4 GHz, and is no less than about 20 dB over the entire frequency range of 2.5 to 5.0 GHz. The through loss ranges from about 0.15 dB, to about 0.23 dB at the highest frequency.

Other embodiments of the invention will be apparent to those skilled in the art. For example, the coaxial connector may be dispensed with, and another printed-circuit board can make connection to the second unbalanced transmission line (2) at the third transverse plane (33).

What is claimed is:

1. An arrangement including a housing and a printed-circuit board defining a transmission line, said arrangement comprising:

an end portion of said housing made from a dielectric material, said end portion of said housing defining a flat lower surface, and also defining planar first and second upper surfaces, each of which is parallel with said flat lower surface, said first and second upper surfaces of said end portion of said housing being separated by a notch extending from the planes of said first upper surface and said second upper surface part-way to said lower surface of said end portion of said housing, leaving a joining portion of said end portion of said housing supporting said first and second upper surfaces relative to each other:

said printed-circuit board including a portion defining a first unbalanced transmission line by which connection is made between elements associated with said board and the exterior of said housing, said first unbalanced transmission line including an electrical strip conductor and an electrical ground plane lying at least to the sides of said strip conductor, at least a portion of said printed-circuit board defining said first unbalanced transmission line extending over at least a part of said first upper surface of said end portion of said housing, with said first unbalanced transmission line ending at a first transverse plane perpendicular to said first upper surface and transverse to the direction of electromagnetic energy flow on said first transmission line;

a coplanar second unbalanced transmission line defined on said second upper surface, and extending from a second transverse plane to a third transverse plane, which second and third transverse planes are parallel to said first transverse plane, said second unbalanced transmission line defining a strip conductor and ground planes on both sides of said strip conductor, a portion of said second unbalanced transmission line near said third transverse plane being available for connections to circuits outside of said housing;

a third unbalanced transmission line lying in an intermediate plane lying between the planes of said upper and lower surfaces of said end portion of said housing, and parallel thereto, said third unbalanced transmission line defining a strip conductor and an electrical ground plane lying at least to the sides of said strip conductor, said third unbalanced transmission line extending between said first and second transverse planes;

a planar first three-conductor transmission line extending between said first unbalanced transmission line and said third unbalanced transmission line at said first transverse plane, said first three-conductor transmission-line including a center via connected at one end to said strip conductor of said first unbalanced transmission line, and at the other end to said strip conductor of said third unbalanced transmission line, said first three-conductor transmission line also including first and second ground vias symmetrically disposed relative to said center via, said first and second ground vias of said first three-conductor transmission line being connected at one end to said ground plane of said first unbalanced transmission line at locations symmetrically disposed about said strip conductor of said first transmission line, said first and second ground vias of said first three-conductor transmission line being connected at their other ends to said ground plane of said third unbalanced transmission line at locations symmetrically disposed about said strip conductor of said third unbalanced transmission line;

a planar second three-conductor transmission line extending between said second unbalanced transmission line and said third unbalanced transmission line at said second transverse plane, said second three-conductor transmission-line including a center via connected at one end to said strip conductor of said second unbalanced transmission line, and at its other end to said strip conductor of said third unbalanced transmission line, said second three-conductor transmission line also including first and second ground vias symmetrically disposed relative to said center via, said first and second ground vias of said second three-conductor transmission line being connected at one end to said ground plane of said second unbalanced transmission line at locations symmetrically disposed about said strip conductor of said second transmission line, said first and second ground vias of said second three-conductor transmission line being connected at their other ends to said ground plane of said third unbalanced transmission line at locations symmetrically disposed about said strip conductor of said third unbalanced transmission line.

2. An arrangement according to claim 1, wherein said first unbalanced transmission line is a microstrip transmission line in which said strip conductor lies in a different plane from said ground plane, and said ground plane, near said first transverse plane, extends under said strip conductor, except at the location of said center via of said first three-conductor transmission line.

3. An arrangement according to claim 1, wherein said first unbalanced transmission line is a coplanar transmission line, in which said strip conductor lies in the same plane as said ground plane.

4. An arrangement according to claim 1, further comprising:

a seal member lying in said notch, the upper surface of said seal member being essentially coplanar with said first upper surface; and a lid extending over said housing and said seal member.

5. An arrangement according to claim 4, wherein said lid is flat.

6. An arrangement according to claim 1, further comprising a center pin electrically continuous with, and mounted on, said strip conductor of said second unbalanced transmission line, said center pin defining an axis which lies parallel with said lower plane, said center pin extending away from said housing.

7. An arrangement according to claim 6, further comprising a shroud in the form of a half-cylinder, said shroud being mounted on said ground conductors of said second unbalanced transmission line, with the axis of said half-cylinder parallel with the axis of said center pin.

* * * * *